(12) United States Patent
Faul et al.

(10) Patent No.: US 9,748,259 B1
(45) Date of Patent: Aug. 29, 2017

(54) METHOD OF FORMING A SEMICONDUCTOR DEVICE STRUCTURE AND SEMICONDUCTOR DEVICE STRUCTURE

(71) Applicant: GLOBALFOUNDRIES Inc., Grand Cayman (KY)

(72) Inventors: Juergen Faul, Radebeul (DE); Frank Jakubowski, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/053,485

(22) Filed: Feb. 25, 2016

(51) Int. Cl.
| | |
|---|---|
| *H01L 27/11568* | (2017.01) |
| *H01L 21/762* | (2006.01) |
| *H01L 21/28* | (2006.01) |
| *H01L 21/308* | (2006.01) |
| *H01L 21/311* | (2006.01) |
| *H01L 21/3065* | (2006.01) |
| *H01L 21/265* | (2006.01) |
| *H01L 27/11521* | (2017.01) |
| *H01L 27/12* | (2006.01) |
| *H01L 29/423* | (2006.01) |

(52) U.S. Cl.
CPC .. *H01L 27/11568* (2013.01); *H01L 21/26513* (2013.01); *H01L 21/28273* (2013.01); *H01L 21/28282* (2013.01); *H01L 21/308* (2013.01); *H01L 21/3065* (2013.01); *H01L 21/31116* (2013.01); *H01L 21/31144* (2013.01); *H01L 21/76283* (2013.01); *H01L 27/11521* (2013.01); *H01L 27/1207* (2013.01); *H01L 29/42336* (2013.01); *H01L 29/42352* (2013.01)

(58) Field of Classification Search
None
See application file for complete search history.

(56) References Cited

U.S. PATENT DOCUMENTS 6,018,185 A * 1/2000 Mitani .............. H01L 21/28518
257/374
6,583,451 B2 * 6/2003 Skotnicki ............... B82Y 10/00
257/103

(Continued)

OTHER PUBLICATIONS

Lee et al., "Selective Etching of Thick Si3N4, SiO2 and Si Using CF4/O2 and C2F6 Gases with or without O2 or Ar Addition," Journal of the Korean Physical Society, 54:1816-23, May 2009.

(Continued)

*Primary Examiner* — Reema Patel
*Assistant Examiner* — Steven Christopher
(74) *Attorney, Agent, or Firm* — Amerson Law Firm, PLLC

(57) ABSTRACT

The present disclosure provides, in accordance with some illustrative embodiments, a semiconductor device structure including a hybrid substrate comprising an SOI region and a bulk region, the SOI region comprising an active semiconductor layer, a substrate material, and a buried insulating material interposed between the active semiconductor layer and the substrate material, and the bulk region being provided by the substrate material, an insulating structure formed in the hybrid substrate, the insulating structure separating the bulk region and the SOI region, and a gate electrode formed in the bulk region, wherein the insulating structure is in contact with two opposing sidewalls of the gate electrode.

19 Claims, 8 Drawing Sheets

(56) References Cited

U.S. PATENT DOCUMENTS

| | | | | |
|---|---|---|---|---|
| 9,159,822 B2* | 10/2015 | Basu | ................ | H01L 29/205 |
| 2012/0049249 A1* | 3/2012 | Zhu | ................ | H01L 21/76224 |
| | | | | 257/288 |
| 2012/0261792 A1* | 10/2012 | Cheng | ................ | H01L 21/84 |
| | | | | 257/510 |
| 2013/0026570 A1* | 1/2013 | Fan | ................ | H01L 21/84 |
| | | | | 257/347 |
| 2014/0091281 A1* | 4/2014 | Cheng | ................ | B82Y 10/00 |
| | | | | 257/39 |
| 2015/0243773 A1* | 8/2015 | Basu | ................ | H01L 29/205 |
| | | | | 257/194 |

OTHER PUBLICATIONS

Rack, Plasma Etching Presentation, University of Tennessee.

\* cited by examiner

METHOD OF FORMING A SEMICONDUCTOR DEVICE STRUCTURE AND SEMICONDUCTOR DEVICE STRUCTURE

BACKGROUND

1. Field of the Disclosure

The present disclosure generally relates to methods of forming semiconductor device structures and the resulting device structures, and, more particularly, to the fabrication of semiconductor device structures in FDSOI techniques implementing flash devices.

2. Description of the Related Art

In systems requiring a significant amount of non-volatile solid state storage, flash memory devices became the dominant memory type due to the low costs as compared to byte-programmable EEPROM, and the relatively simple structure of flash memory cells. As flash memories are generally a type of nonvolatile memory storage, which may be electrically erased and programmed, recent applications for flash memory devices aim at a replacement for hard discs, as flash memory devices do not have the mechanical limitations and latencies of hard drives, so a solid state drive (SSD) implemented by flash memory devices is attractive when considering speed, noise, power consumption and reliability.

Generally, information is stored in a flash memory via an array of memory cells fabricated in accordance with floating gate techniques or charge trap flash (CTF) techniques. Herein, CTF is a term that will be used to generally refer to a semiconductor memory technology used in creating non-volatile NOR and NAND flash memory, a technology that differs from the more conventional floating gate technology in that a silicon nitride film is used to store electrons rather than the doped polycrystalline silicon typical of a floating gate structure. In a CTF device, electrons are stored in a trapping layer just as they are stored in the floating gate, however, the nitride layer, in accordance with CTF being an insulator, while the floating gate is made from a conductor. Therefore, upon high stress being imposed on the tunnel oxide layer of floating gate transistors (the floating gate is separated from a general region formed between source and drain by the tunnel oxide), disruptions in the crystal lattice of the tunnel oxide layer are created, resulting in so-called "oxide defects." If a large number of such disruptions are created, a short circuit is very likely to develop between the floating gate and the transistor's channel, causing the floating gate to no longer hold a charge. By contrast, CTF devices are immune to such difficulties, since charges are trapped in a nitride layer acting as a charge trapping layer instead of the floating gate. In case oxide defects appear in the oxide layer separating the charge trapping layer from the channel region below, charges of the charge trapping layer will only be drained off at regions in immediate contact with the site of the oxide defect, leaving the other electrons in place to continue to control the threshold voltage of a CTF transistor.

In CTF devices, electrons are moved onto the charge trapping layer similarly to the way that floating gate NOR flash may be programmed, i.e., through channel hot electron (CHE) injection, which is also known as hot carrier injection. Briefly, a high voltage is applied to the control gate, while a medium high voltage is applied to source and drain, and a current is induced from source to drain. As a result, electrons having sufficient energy in traversing through the high field region near the drain will be injected into the charge trapping layer where they come to rest. Charges may be removed from the charge trapping layer via hot hole injection as opposed to the well-known Fowler-Nordheim tunneling approach used in NAND and NOR/devices for erasing information. Accordingly, erasing information in CTF devices rather uses an electric field than a current that is necessary for Fowler-Nordheim tunneling, to move holes towards the charge trapping layer.

Manufacturing floating gate devices and CTF devices is very similar as both techniques use a stacked gate structure in which a floating gate or charge trapping layer lies immediately above the channel and below a control gate. In both techniques, an oxide layer is formed in between the floating gate or charge trapping layer and the channel, and between the control gate and the floating gate or charge trapping layer. Therefore, aside from the storage layer made of a conductive material in the case of a floating gate or of nitride in the case of CTF, the materials for all the remaining layers of the stacked gate structure are actually very similar in both approaches.

Currently, fully depleted silicon-on-insulator (FDSOI) is a favorite basis for next generation technologies in the fabrication of semiconductor devices at 22 nm and beyond. Herein, a semiconductor device, such as a MOSFET, is formed on a semiconductor layer having a thickness such that a depletion region covers the whole semiconductor layer and a buried oxide layer (BOX) is interposed between the semiconductor layer and a substrate material. Although FDSOI techniques are simple (when compared to 3-dimensional techniques, such as FINFETs and the like), the implementation of flash devices in FDSOI techniques raises several challenges, such as an excessive topography.

In view of the above, it is desirable to provide a method of forming a semiconductor device structure and a semiconductor device structure that allow the implementation of flash memory in FDSOI techniques at advanced technology nodes.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In one illustrative embodiment disclosed herein, a method of forming a semiconductor device structure is disclosed. In accordance with some illustrative embodiments herein, the method includes providing an SOI substrate comprising an active semiconductor layer, a substrate material, and a buried insulating material interposed between the active semiconductor layer and the substrate material, forming an insulating structure in the SOI substrate, the insulating structure laterally separating a first substrate portion from two adjacent SOI substrate portions, forming a recess in the first substrate portion, the recess exposing an upper surface portion of the substrate material, and forming a gate electrode in the recess.

In another illustrative embodiment disclosed herein, a method of forming a semiconductor device structure is disclosed. In accordance with some illustrative embodiments herein, the method includes providing an SOI substrate comprising an active semiconductor layer, a substrate material, and a buried insulating material interposed between the active semiconductor layer and the substrate material, forming an insulating structure in the SOI substrate, the insulating structure laterally separating a first substrate portion from two adjacent SOI substrate portions, forming a recess in the first substrate portion, the recess exposing an upper surface portion of the substrate material, forming one of a SONOS structure, a MONOS structure and a floating gate in the recess, and subsequently forming a gate electrode in the recess.

In yet another illustrative embodiment disclosed herein, a semiconductor device structure is provided. In accordance with some illustrative embodiments herein, the semiconductor device structure includes a hybrid substrate comprising an SOI region and a bulk region, the SOI region comprising an active semiconductor layer, a substrate material, and a buried insulating material interposed between the active semiconductor layer and the substrate material, and the bulk region being provided by the substrate material, an insulating structure formed in the hybrid substrate, the insulating structure separating the bulk region and the SOI region, and a gate electrode formed in the bulk region, wherein the insulating structure is in contact with two opposing sidewalls of the gate electrode.

BRIEF DESCRIPTION OF THE DRAWINGS

The disclosure may be understood by reference to the following description taken in conjunction with the accompanying drawings, in which like reference numerals identify like elements, and in which.

Figure 1A:
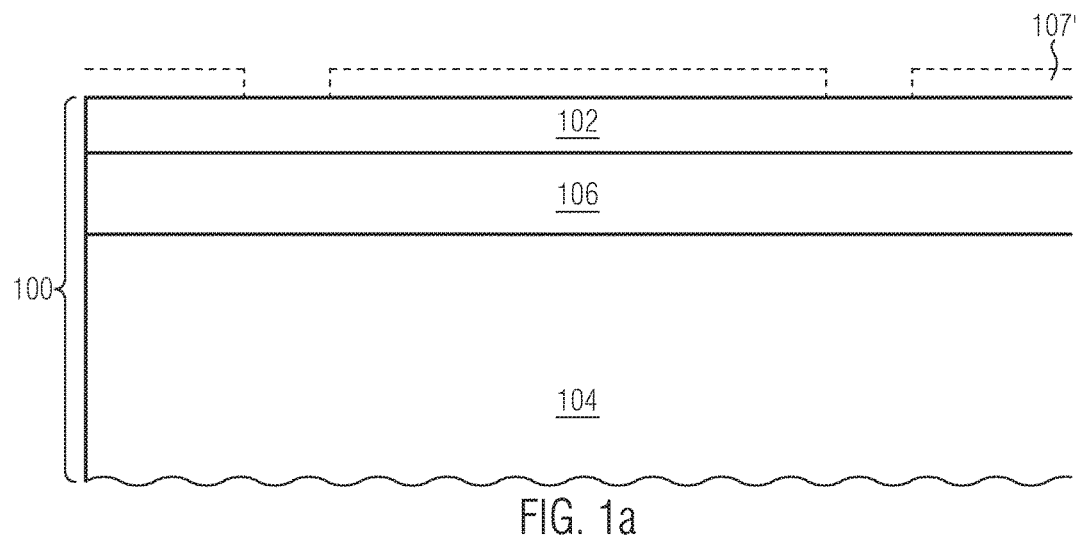
FIGS. 1a-1o schematically illustrate, in cross-sectional views, a fabrication process of forming a semiconductor device structure in accordance with some illustrative embodiments of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase. For example, the person skilled in the art will appreciate after a complete reading of the present disclosure that the expression "A over B" is not limited to the understanding that A is directly disposed on B, i.e., A and B being in physical contact.

The present disclosure shows, in accordance with some illustrative embodiments of the present disclosure, the fabrication of semiconductor devices structures, such as a plurality of MOSFET or MOS devices integrated on a chip. When referring to MOS devices, the person skilled in the art will appreciate that, although the expression "MOS device" is used, no limitation to a metal-containing gate material and/or to an oxide-containing gate dielectric material is intended. Accordingly, a semiconductor device structure may be understood as comprising at least two MOS devices of at least one of a P-type and an N-type.

Semiconductor devices of the present disclosure may concern devices which may be fabricated by using advanced technologies, i.e., the semiconductor devices may be fabricated by technologies applied to approach technology nodes smaller than 100 nm, for example, smaller than 50 nm or smaller than 35 nm, e.g., at 22 nm or below. After a complete reading of the present application, a person skilled in the art will appreciate that, according to the present disclosure, ground rules smaller or equal to 45 nm, e.g., at 22 nm or below, may be imposed. The present disclosure proposes semiconductor devices that may have structures of minimal length dimensions and/or width dimensions smaller than 100 nm, for example, smaller than 50 nm or smaller than 35 nm or smaller than 22 nm. For example, the present disclosure may provide semiconductor devices fabricated by using 45 nm technologies or below, e.g., 22 nm or even below.

The semiconductor devices disclosed herein may be fabricated as P-channel MOS transistors or PMOS transistors and N-channel transistors or NMOS transistors; both types of transistors may be fabricated with or without mobility-enhancing stressor features or strain-inducing features. It is noted that a circuit designer can mix and match device types, using PMOS and NMOS devices, stressed and unstressed, to take advantage of the best characteristics of each device type as they best suit the semiconductor device under design.

Furthermore, semiconductor devices as disclosed herein may be formed as bulk devices and/or SOI (semiconductor-on-insulator) devices. The expression SOI is not intended as being limited to a special kind of conventional semiconductor-on-insulator device, but, in general, SOI devices as disclosed herein have an active semiconductor layer disposed on a buried insulating material layer, which, in turn, is formed on a base substrate material. In accordance with some illustrative embodiments herein, the active semiconductor layer may comprise one of silicon, germanium, silicon germanium and the like. The buried insulating material layer may comprise an insulating material, e.g., silicon oxide or silicon nitride. The base substrate material may be a base material that may be used as a substrate as known in the art, e.g., silicon and the like.

In accordance with at least some of the herein disclosed illustrative embodiments employing FDSOI substrates, the active semiconductor layer may have a thickness of about 20 nm or less, while the buried insulating material layer may have a thickness of about 145 nm or, in accordance with advanced techniques, the buried insulating material layer may have a thickness in a range from about 10-30 nm. For example, in some special illustrative embodiments of the present disclosure, the active semiconductor layer may have a thickness of about 3-10 nm.

As to a crystalline plane orientation of the base substrate material, similar to that of an ordinary silicon device, an SOI substrate having a surface with a face (100) may be used. However, in order to improve the performance of a PMOS semiconductor device, a surface of the PMOS semiconductor device may be used as a face (110). Alternatively, a hybrid plane orientation substrate whose surface may be mixed by a face (100) and a face (110) may be used. In alternative embodiments, the base substrate material may be of an N-type when N-accumulation and/or N-inversion devices are considered (otherwise P-type for P-accumulation and/or P-inversion).

FIG. 1a schematically illustrates, in a cross-sectional view, an SOI substrate 100 comprising an active semiconductor layer 102, a substrate material 104, and a buried insulating material 106 interposed between the active semiconductor layer 102 and the substrate material 104. In accordance with some illustrative embodiments of the present disclosure, the active semiconductor layer 102 may comprise a semiconductor material, such as silicon, germanium, silicon germanium, and the like, while the buried insulating material 106 may be a buried oxide material (e.g., BOX), a buried nitride material and the like. The substrate material 104 may be formed by a known bulk substrate, such as a silicon bulk substrate, a germanium bulk substrate, a silicon germanium bulk substrate and the like.

In accordance with some illustrative embodiments of the present disclosure, the SOI substrate 100 may be provided at an early stage during fabrication. In accordance with some illustrative examples, the SOI substrate 100 may be formed by known fabrication methods, such as SIMOX or smart cut techniques.

As schematically depicted in FIG. 1a, a process of forming an insulating structure may be initiated by forming a masking pattern 107' over the SOI substrate 100 as indicated by broken lines in FIG. 1a. The masking pattern 107' may be formed by known lithographical methods and may comprise a resist mask or a hard mask. In accordance with some illustrative embodiments of the present disclosure, the masking pattern 107' may comprise a patterned nitride material layer formed over the SOI substrate 100.

Figure 1B:
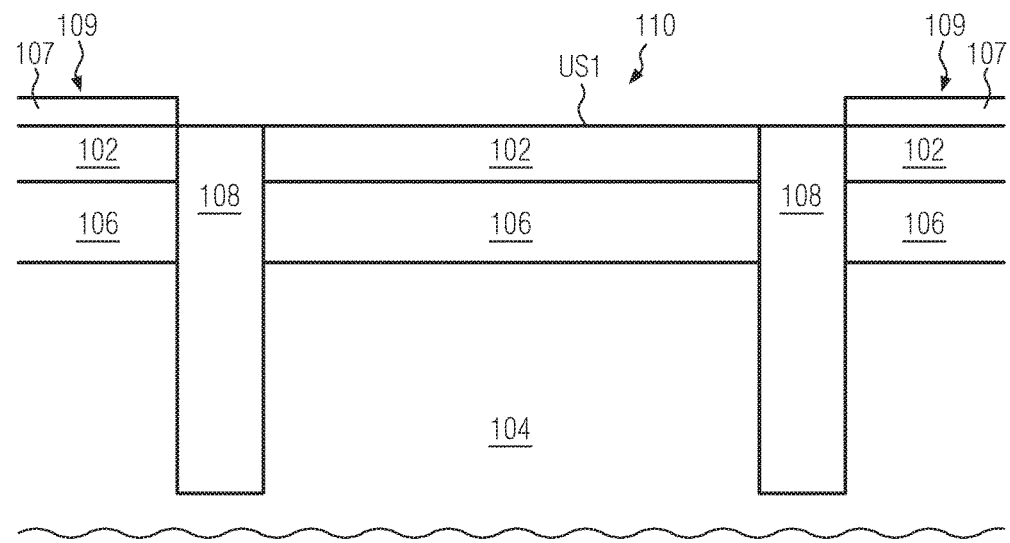

FIG. 1b schematically illustrates the SOI substrate 100 at a more advanced stage during fabrication, after an insulating structure 108 is formed in the SOI substrate 100, the insulating structure 108 laterally separating a substrate portion 110 from adjacent SOI substrate portions 109. After a complete reading of the present disclosure, the person skilled in the art will appreciate that the substrate portion 110 may be a first substrate portion as referred to in the first and second aspects above. Alternatively or additionally, the person skilled in the art will appreciate after a complete reading of the present disclosure that the substrate portion 110 may represent a portion which is to be prepared as a bulk region as referred to above in the third aspect of the present disclosure.

In accordance with some illustrative embodiments of the present disclosure, the insulating structure 108 may be formed by a process comprising: forming the masking pattern 107' (see FIG. 1a), anisotropically etching the SOI substrate 100 through the masking pattern 107' for forming trenches (not illustrated) in the SOI substrate 100, filling the trenches with an insulating material, e.g., one of an oxide material and a nitride material, and planarizing the insulating material to form the insulating structure 108 as depicted in FIG. 1b. In accordance with some illustrative embodiments herein, the masking pattern 107' may be one of a resist mask or a hard mask, e.g., a nitride hard mask. The person skilled in the art will appreciate that, in accordance with some illustrative examples, the masking pattern 107' may be formed in accordance with known lithographical techniques.

In accordance with some special illustrative embodiments of the present disclosure, the insulating structure 108 may be formed in accordance with known techniques for forming shallow trench isolations (STIs), wherein the trenches are etched for partially exposing an upper surface of the substrate material 104. Alternatively, the trenches may be etched to partially extend into the substrate material 104 such that the resulting insulating structures (i.e., insulating structure 108 in FIG. 1b) may be partially embedded into the substrate material 104. Accordingly, the person skilled in the art will appreciate that the illustrated embodiments are only illustrative in this regard and no limitation as to the length of the insulating structure 108 extending into the substrate material 104 is intended.

With regard to FIG. 1b, a masking pattern 107 may be subsequently formed, the masking pattern 107 leaving an upper surface US1 of the substrate region 110, i.e., the active semiconductor layer 102, exposed to further processing, while substrate regions 109 are covered by the masking pattern 107. In accordance with some special illustrative embodiments of the present disclosure, the masking pattern 107 may be based on the masking pattern 107' in FIG. 1a, wherein the masking pattern 107' may be patterned via known patterning techniques so as to expose the upper surface US1. Alternatively, the masking pattern 107 may be formed after completely removing the masking pattern 107'.

Figure 1C:
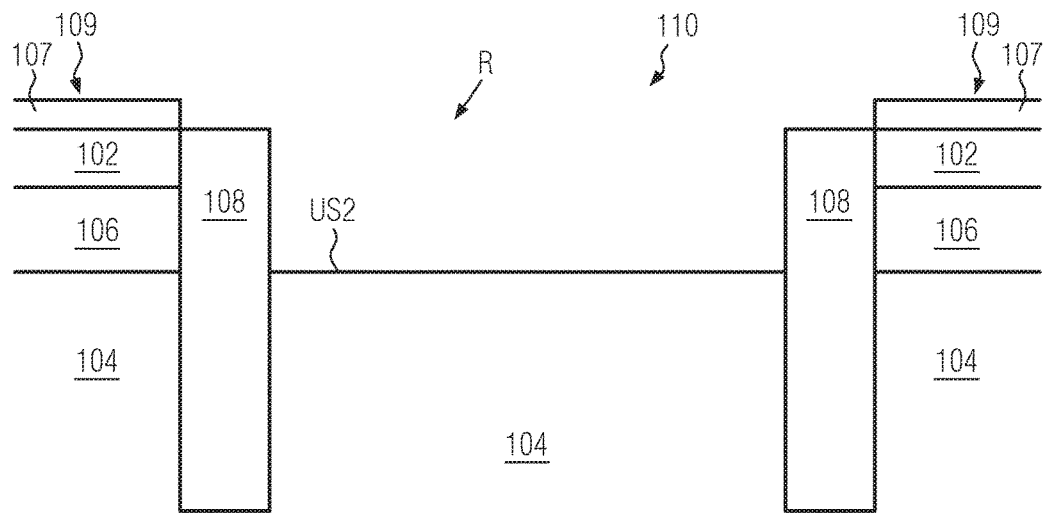

FIG. 1c schematically illustrates the substrate portion 110 and the SOI substrate portions 109 at a more advanced stage during fabrication, after the active semiconductor layer 102 and the buried insulating material layer 106 are removed in the substrate portion 110 in accordance with the masking pattern 107 and a recess R is formed in the substrate portion 110 relative to the SOI substrate portions 109. Herein, an etching process (not illustrated) may be performed, optionally comprising plural etching steps, for anisotropically and sequentially etching the active semiconductor layer 102 and the buried insulating material layer 106. Accordingly, an upper surface US2 of the bulk semiconductor material 104 is exposed in the substrate portion 110 in alignment with the masking pattern 107 and the insulating structure 108.

Figure 1D:
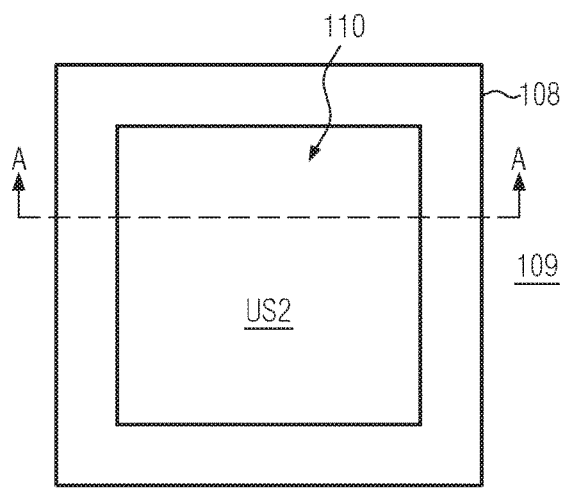

FIG. 1d schematically illustrates a top view of the substrate portion 110, the insulating structure 108 and the SOI substrate portions 109, where a cross-section according to line A-A corresponds to the cross-sectional view as depicted in FIG. 1c.

After a complete reading of the present disclosure, the person skilled in the art will appreciate that a shape of the substrate portion 110 and the insulating structure 108 may deviate from the depicted rectangular shape and that no limitation on a specific shape is intended. Furthermore, the person skilled in the art will appreciate that the figures are only schematic and no limitation on scalings, distances, ratios of size and distance, and the like is intended. Particularly, no limitation on a ratio of a width of the insulating structure 108 to a width of the substrate portion 110 and/or a ratio of a surface area of the substrate portion 110 and a surface area of the insulating structure 108 is intended.

Figure 1E:
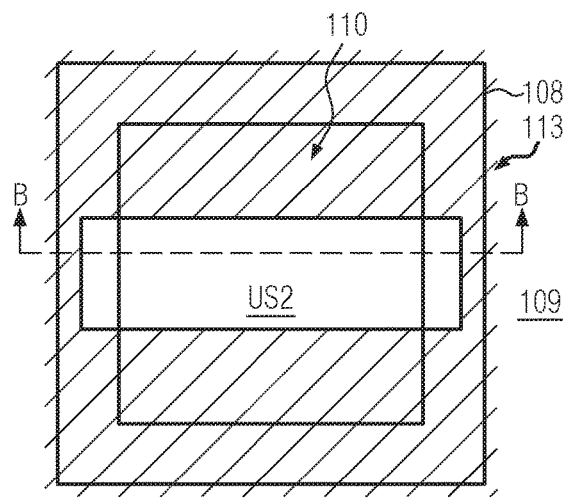

FIG. 1e schematically illustrates the recess R in the substrate portion 110, the insulating structure 108 and the SOI substrate portions 109 at a more advanced stage during fabrication, after a masking pattern 113 (see hatching in the top view as depicted in FIG. 1e) is formed, the masking pattern 113 being partially formed in the recess R. In accordance with some illustrative embodiments of the present disclosure, the masking pattern 113 may cover the SOI portions 109, may partially cover the insulating structure 108, and may partially cover the upper surface US1 in FIG. 1c such that an upper surface portion US2 of the upper surface US1 is exposed to further processing. After a complete reading of the present disclosure, the person skilled in the art will appreciate that the masking pattern 113 may not be limited to the configuration as illustrated in FIG. 1e, and that the masking pattern 113 may be provided instead via two masking strips supplementing the masking pattern 107 so as to expose the upper surface portion US2 of the substrate portion 110 to further processing.

Figure 1F:
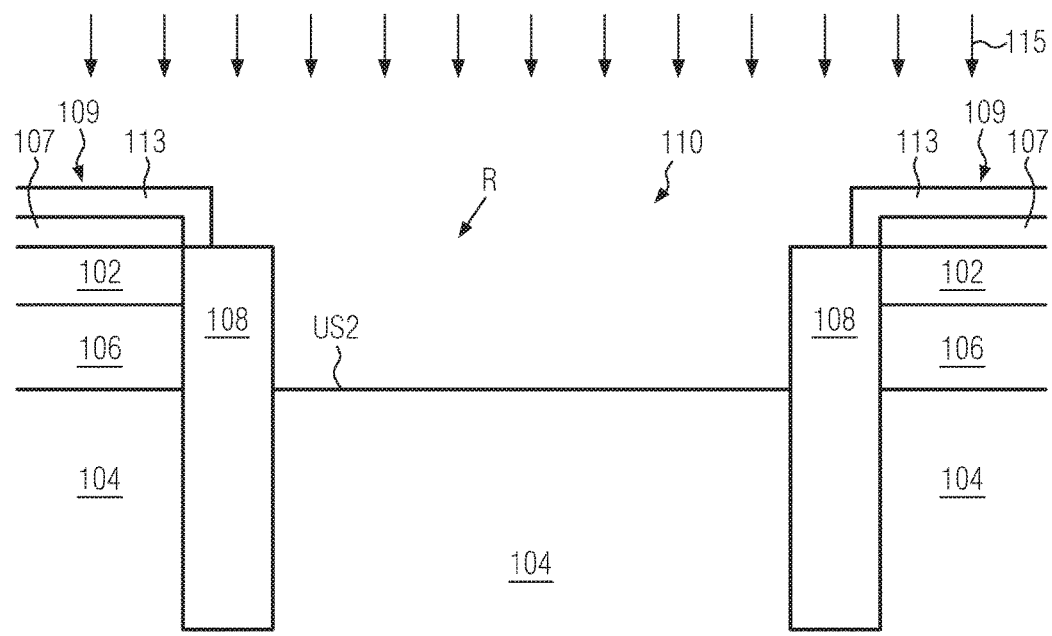

FIG. 1f schematically illustrates the substrate portion 110, the insulating material 108 and the SOI substrate portions 109 in a cross-sectional view along the line B-B in FIG. 1e at a more advanced stage during fabrication, when an etching process 115 is performed in accordance with the masking pattern 113 in the recess R. In accordance with some illustrative embodiments of the present disclosure, the etching process 115 may be unselective with regard to the insulating structure 108 and the substrate material 104 in the substrate portion 110.

In accordance with some illustrative embodiments of the present disclosure, the etching process 115 may be a plasma etching process, e.g. (without limitation), a dry plasma etching process, or a reactive ion etching (RIE) process and the like. In accordance with some special (but not limiting examples), the etching process may comprise a fluorocarbon gas, e.g., $CF_x$ (x=1, 2, 3, 4) and/or $C_2F_6$ and/or $CHF_3$ and/or $CH_2F_2$ and/or $C_3F_8$ and/or $C_4F_8$, where fluorocarbon gases with high C/F ratio have a good selectivity against Si, while maintaining a high etch rate of $SiO_2$ in semiconductor devices. In accordance with some illustrative examples herein, at least one additive gas may be provided, such as at least one of $O_2$ and $H_2$. For example, including O2 at an amount in the range from about 0-10% (relative to $CF_4$), a relative etch rate of poly to siliconoxide from less than 0.2 to about 1.0 may be achieved, while in the range from about 10-60%, the relative etch rate of poly to oxide decreases from about 1.0 to about 0.2 (the plot of the amount of $O_2$ (x-axis) to the relative etch rate (y-axis) shows a peak at about 0.2% of about 1.0). In some illustrative examples, including $H_2$ in the amount of 0-60% shows an etch rate of $SiO_2$ from about 50-60 nm/min to an etch rate slightly above 40 nm/min, while poly may be etched at a rate of about 40-45 nm/min (at about 0%) to about 0-5 nm/min (at about 60%) when adding $H_2$. Accordingly, etch rates may be tuned when adding one of $O_2$ and $H_2$ in low amounts to $CF_4$ in dry plasma etching processes, for example.

Figure 1G:
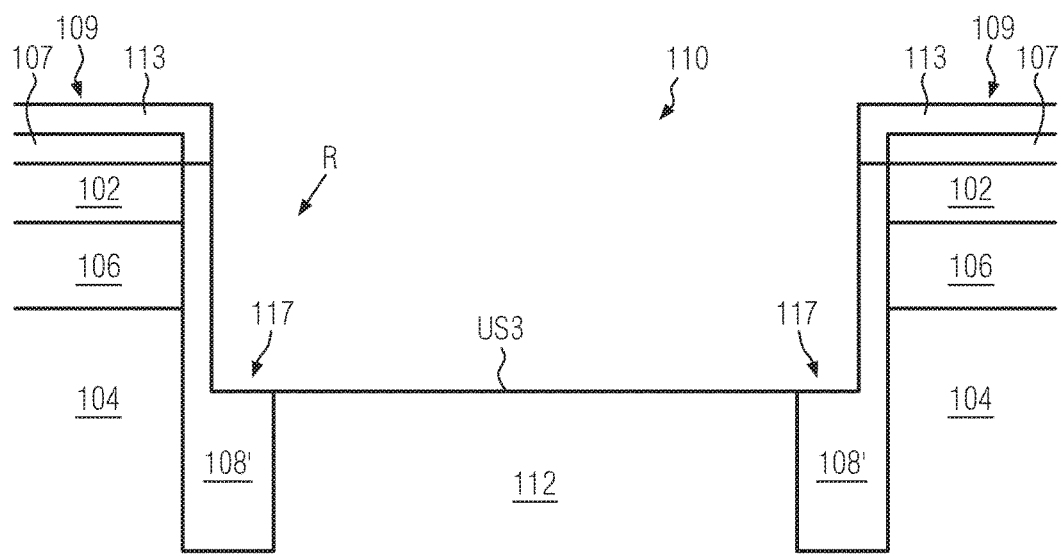

FIG. 1g schematically illustrates the substrate portion 110 at a more advanced stage during fabrication, after the etching process 115 is completed and the insulating structure 108 and the substrate material 104 are unselectively etched and partially recessed. Accordingly, an etched insulating structure 108' and an etched substrate material 112, having an upper surface portion US3 relative to substrate material 108 covered by the masking pattern 113 and relative to insulating structure 108 covered by the masking pattern 113 may be provided. The substrate material 112 in the recess R may be partially etched back relative to the substrate material 104 in the substrate portion 110 covered by the masking pattern 113. Similarly, the insulating structure 108 may be partially etched back in the exposed region of the masking pattern 113 relative to the insulating structure 108 being protected by the masking pattern 113. In accordance with the schematic illustration in FIG. 1g, a recessed portion 117 of the insulating structure 108' is formed in accordance with the masking pattern 113. After a complete reading of the present disclosure, the person skilled in the art will appreciate that the recessed portion 117 may have a stepping towards the material of the insulating structure 108 covered by the masking pattern 113.

Figure 1H:
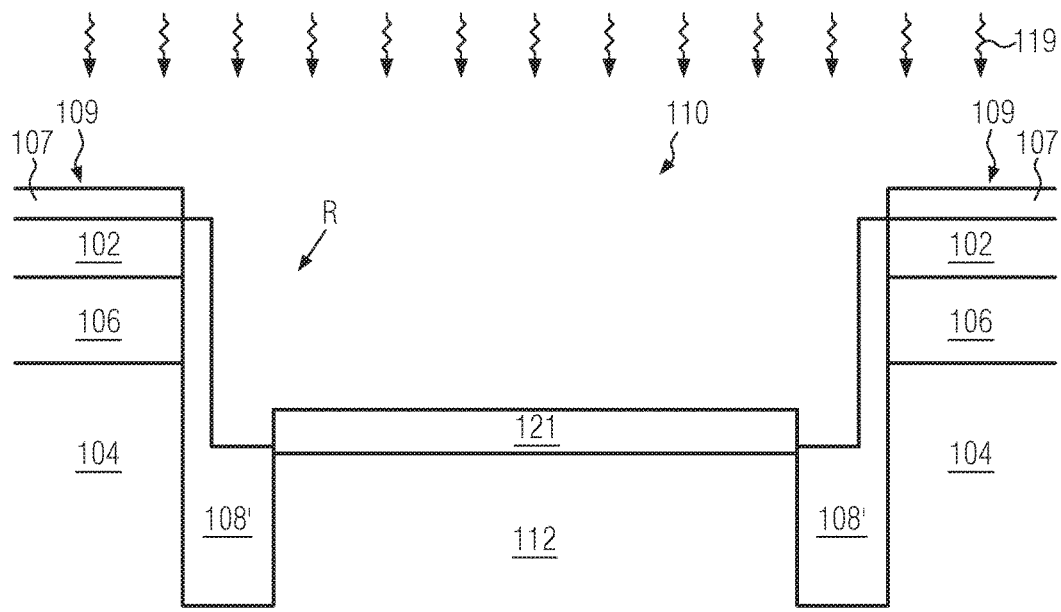

FIG. 1h schematically illustrates the substrate portion 110 at a more advanced stage during fabrication, after a process 119 is performed. In accordance with some illustrative embodiments of the present disclosure, the process 119 may be a thermal oxidation process or may be a rapid thermal oxidation (RTO) process. In the case of a thermal oxidation, the process 119 may be performed in a furnace having an oxygen-containing atmosphere at about 600-800° C., e.g., in a time interval of about 0.5-30 minutes. Alternatively, the process 119 may be implemented as an RTO and may be performed in an oxygen-containing atmosphere at about 800-1000° C., e.g., in a time interval of about 5-60 seconds. During the process 119, an oxide layer 121 may be formed on the substrate material 112 in alignment with the insulating structure 108'.

After a complete reading of the disclosure, the person skilled in the art will appreciate that, in accordance with some illustrative embodiments of the present disclosure, the masking pattern 113 may have been removed at the stage as depicted in FIG. 1h, that is, the substrate material 104 and the substrate material 112 in the substrate portion 110 may be exposed to the process 119. However, this does not pose any limitation to the present disclosure and the substrate material 104 in the substrate portion 110 may remain covered. The person skilled in the art will appreciate that, in any case, the SOI substrate portions 109 may remain protected during the process 119 by the masking pattern 107. For example, after the stage illustrated in FIG. 1g, a removal process (not illustrated) for removing the masking pattern 113 may be performed, optionally including a cleaning process. However, as pointed out above, this does not pose any limitation on the present disclosure, and the person skilled in the art will appreciate that the masking pattern 113 may remain (not illustrated in FIG. 1h and following).

Figure 1I:
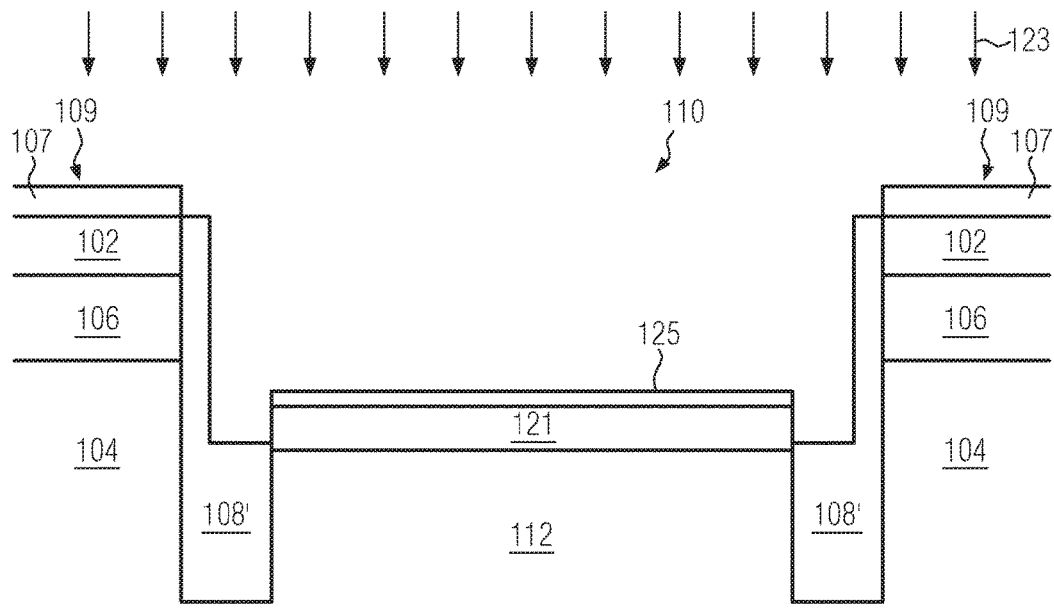

FIG. 1i schematically illustrates the substrate portion 110 at a more advanced stage during fabrication, during and after a process 123 is performed and completed. In accordance with some illustrative embodiments of the present disclosure, the process 123 may comprise a process for depositing a nitride material on the oxide layer 121. In accordance with some illustrative examples herein, the process 123 may comprise a decoupled plasma nitridation (DPN) using an inductive coupling to generate a nitrogen plasma and to incorporate a high level of nitrogen uniformly into the top surface of the oxide layer 121. For example, the process 123 may be performed in a vacuum chamber (not shown), and a gas mixture of nitrogen and an inert gas (e.g., He) may be introduced into the vacuum chamber (not illustrated). Herein, the vacuum chamber (not illustrated) may be maintained at a preselected pressure during the process 123.

During the DPN, an RF power may be impressed on RF coils (not illustrated) within the vacuum chamber (not illustrated) to energize and maintain a plasma (not illustrated). Upon applying an appropriate RF bias to the substrate 100, a potential difference between the plasma (not illustrated) and the substrate 100 may be achieved and nitrogen may be incorporated into the oxide layer 121 for forming the nitride layer 125. After the DPN, a post nitridation annealing process may be performed at about 700-1100° C. in an inert or oxidizing ambient. After a complete reading of the present disclosure, the person skilled in the art will appreciate that, in accordance with the process 123 comprising DPN, a CTF device may be provided.

In other illustrative embodiments of the present disclosure in which a floating gate device is to be formed, a conductive material may be deposited in the process 123 on the oxide layer 121 to form a floating gate layer 125. In accordance with some illustrative embodiments herein, a polysilicon material or the like may be deposited.

Figure 1J:
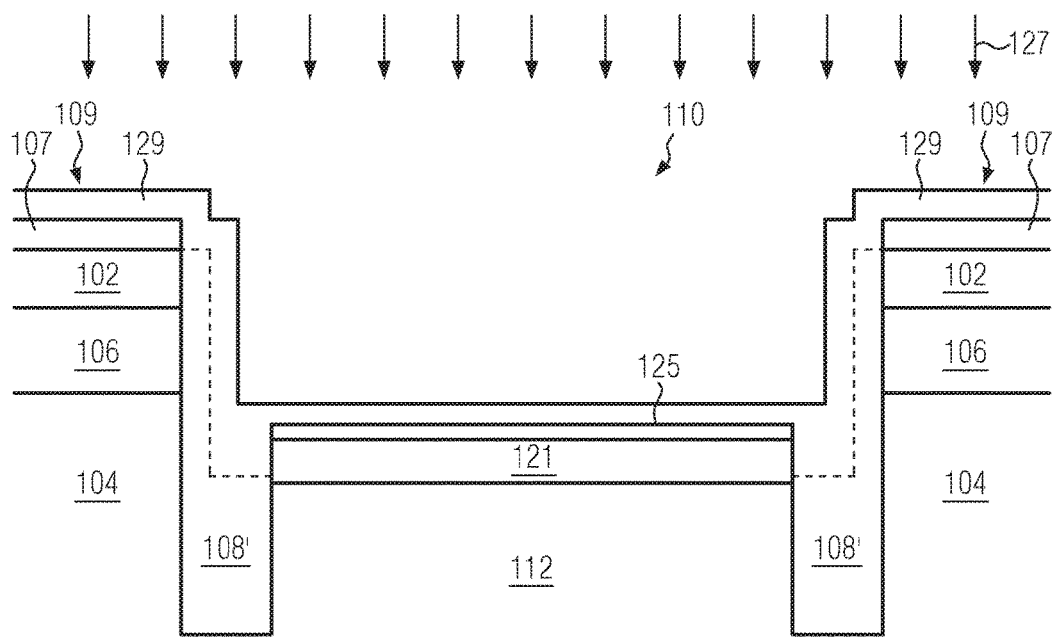

FIG. 1j schematically illustrates the substrate portion 110 at a more advanced stage during fabrication, after a gate insulating material layer 129 is deposited in a process 127. The gate insulating material layer 129 may comprise an oxide material, a high-k material and the like. In case that the gate insulating material 129 corresponds to a material used to form the insulating structure 108, the person skilled in the art will appreciate that the gate insulating material 129 and the insulating structure 108' may be supplemented without an interface between the two layers, while the interface may be present in case that two different materials are employed. This is indicated in FIG. 1j and the following by a broken line. In accordance with some special illustrative examples herein, the insulating structure 108' may be formed by an oxide material, and the gate insulating material layer 129 may be formed by a gate oxide material.

Figure 1K:
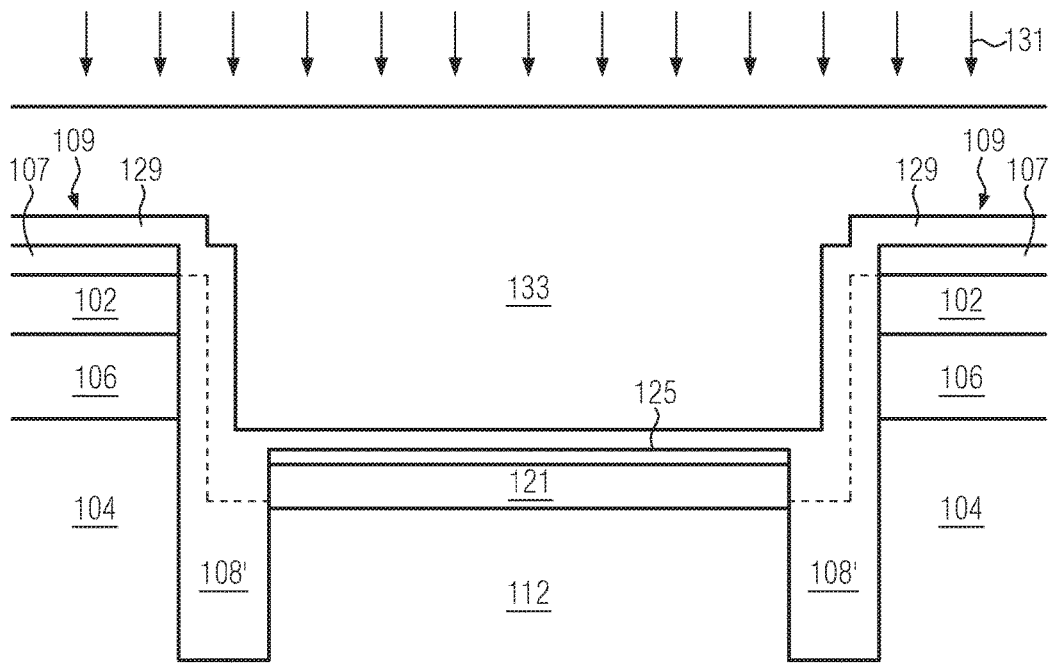

FIG. 1k schematically illustrates the substrate portion 110 at a more advanced stage during fabrication where a process 131 is performed and a gate electrode material 133 is deposited. In accordance with some illustrative examples herein, the gate electrode material 133 may be one of amorphous silicon, polysilicon and a gate metal, such as titanium, aluminum and the like.

Figure 1L:
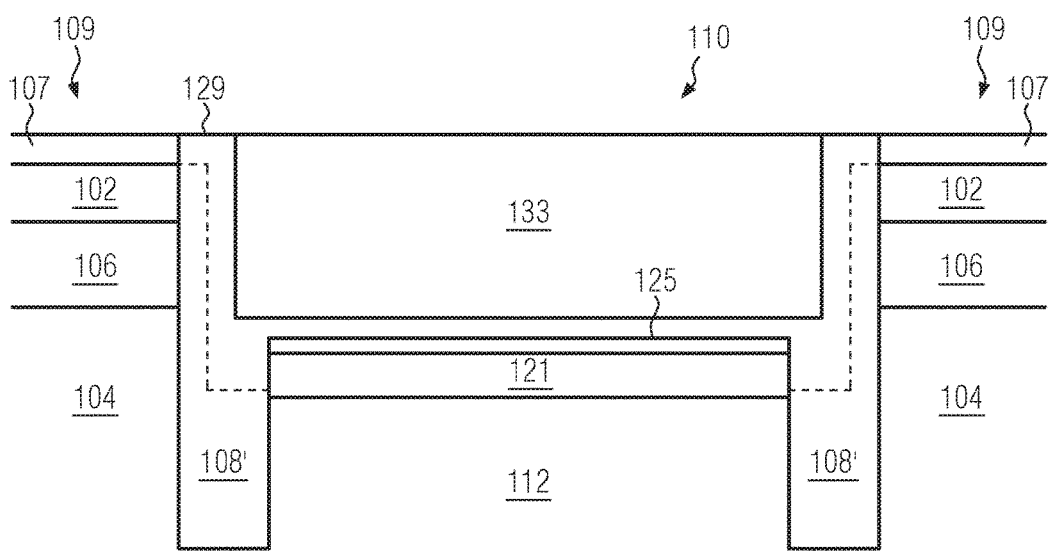

FIG. 1l schematically illustrates the substrate portion at a more advanced stage during fabrication, after a polishing process (not illustrated) is completed and the deposited gate electrode material 133 is leveled relative to the masking pattern 107. In accordance with some illustrative examples herein, the polishing process may comprise a CMP process with end point detection at the masking pattern 107.

Figure 1M:
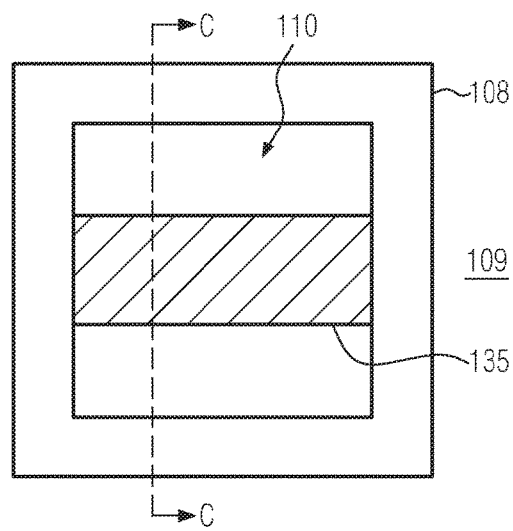

FIG. 1m schematically illustrates the substrate portion 110 in a top view at a more advanced stage during fabrication, after a masking pattern 135, e.g., a strip mask, is formed for patterning the gate structure in the substrate region 110. In accordance with some illustrative embodiments of the present disclosure, the masking pattern 135 may be formed in accordance with known lithographical masking techniques employing resist or hard masking techniques. In accordance with some special illustrative examples herein, the masking pattern 135 and the masking pattern 107 may be related such that the masking pattern 135 may represent the negative of the masking pattern 107 in the substrate portion 110.

After a complete reading of the present disclosure, the person skilled in the art will appreciate that a gate electrode (see gate stack 138 in FIG. 1n) to be subsequently formed in the substrate portion 110 is in contact with the insulating structure 108 at two opposing sidewalls of the gate electrode (see FIG. 1m, wherein the masking pattern 135 contacts the insulating structure 108 at two opposing sides of the masking pattern 135).

Figure 1N:
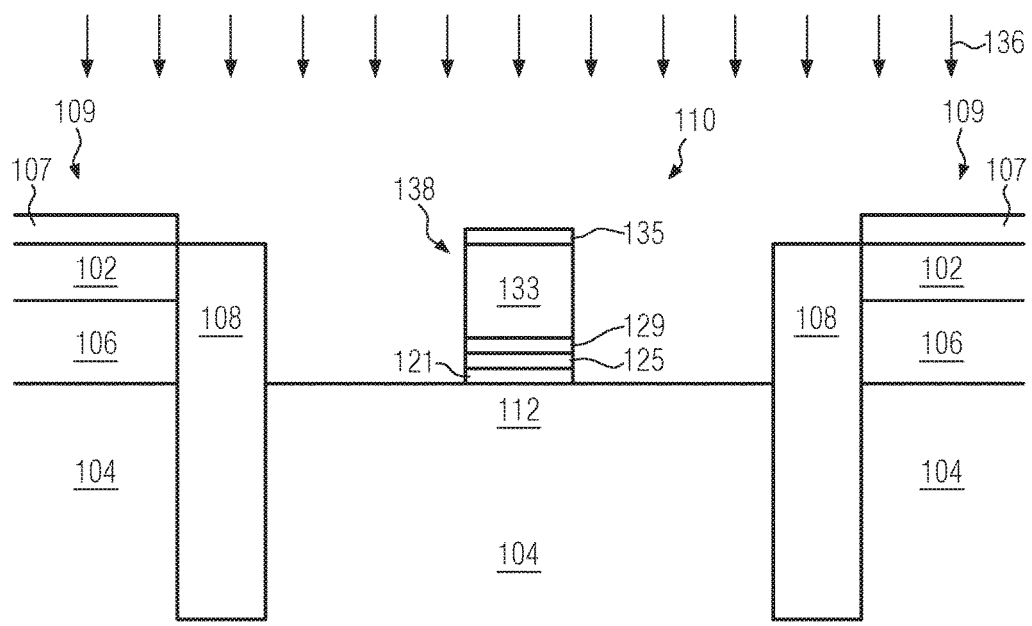

FIG. 1n schematically illustrates the substrate portion 110 in a cross-section view along the line C-C in FIG. 1m at a more advanced stage during fabrication, while a process 136 is performed. The process 136 may comprise, in accordance with some special illustrative examples, an anisotropic etching process as employed in the art for patterning gate stacks. Accordingly, a gate stack 138 comprising the material layers 121, 125, 129, 133 and the masking pattern 135 may be formed in the substrate region 110, leaving upper surface regions of the substrate material 104 exposed.

Figure 1O:
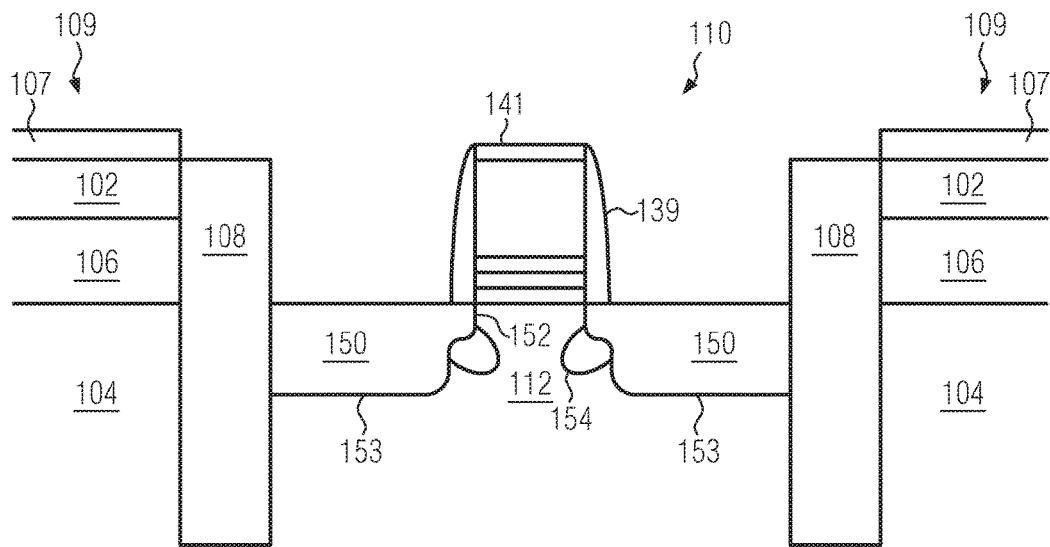

FIG. 1o schematically illustrates the substrate portion 110 at a more advanced stage during fabrication, after implantations for forming source/drain regions 150 in the substrate material 104 within the substrate region 110, and a sidewall spacer structure 139 to the gate stack 138, and a gate cap 141 are formed. The person skilled in the art will appreciate that the sidewall spacer structure 139 may be formed in accordance with known techniques after the masking pattern 135 is removed. Accordingly, source/drain extension regions 152 may be formed in alignment with the gate stack 138 and deep source/drain regions 153 may be formed in alignment with the spacer structure 139 as known in the art. Optionally, HALO regions 154 may be formed within the substrate material 104 for adjusting the threshold voltage.

After a complete reading of the present disclosure, the person skilled in the art will appreciate that the process flow as described above with regard to FIGS. 1a-1o schematically shows, in accordance with some illustrative embodiments of the present disclosure, processes for fabricating a semiconductor device structure, comprising a hybrid substrate comprising an SOI region (see 109 in FIG. 1o) and a bulk region (see 110 in FIG. 1o), the SOI region comprising an active semiconductor layer (see 102 in FIG. 1o), a substrate material (see 104 in FIG. 1o), and a buried insulating material (see 106 in FIG. 1o) interposed between the active semiconductor layer and the substrate material, and the bulk region being provided by the substrate material; an insulating structure (see 108 in FIG. 1o) formed in the hybrid substrate, the insulating structure separating the bulk region and the SOI region; and a gate electrode (see 138 in FIG. 1n) formed in the bulk region, wherein the insulating structure is in contact with two opposing sidewalls of the gate electrode.

The process flow as described above with regard to FIGS. 1a-1o may be continued by a gap-fill (e.g., HDP, HARP, etc.), and a polishing process for polishing down to the masking pattern 107. Furthermore, the fabrication process may be continued in accordance with standard process flows by removing the masking pattern 107 over the SOI substrate regions 109, forming semiconductor devices over the SOI substrate regions 109, performing a contact module for performing contacts to the substrate region 110 and the SOI regions 109, etc. In accordance with some special illustrative examples herein, an early nickel silicidation or a late nickel silicidation process may be performed.

According to the process flow as described above with regard to FIGS. 1a-1o, a buried flash device may be fabricated in a bulk region of an FDSOI substrate 100, wherein the flash device may be formed prior to the fabrication of SOI devices. In accordance with some illustrative embodiments of the present disclosure as discussed above, a planar surface topography may be obtained because the gate stack 138 and the adjacent insulating structure 108/108' may be substantially planar relative to the remaining SOI substrate surface. In accordance with some illustrative embodiments of the present disclosure, a modular process flow may be provided such that a buried flash device fabrication module may be at hand, which may be dropped in and taken out of implemented standard process flows on demand.

The person skilled in the art will appreciate that the gate stack 138 of FIG. 1n may be formed in accordance with CTF techniques or floating gate techniques. In case of CTF techniques, the gate stack 138 may comprise one of a SONOS structure, and a MONOS structure, such as a TANOS or a THNOS structure. In accordance with some illustrative embodiments of the present disclosure as discussed above, the modular process for fabricating the gate stack 138 may only employ three masks, wherein an optional fourth mask may be formed when fabricating flash contacts in a contact module during late nickel silicidation for only contacting flash devices.

In accordance with some illustrative embodiments of the present disclosure, a contacting of a flash gate electrode may be achieved via a logic gate stack using a masked high-k dielectric removal on top of flash gates (optionally implanting contact through high-k removal mask into top of flash poly gate), and the deposition of a metal/poly material stacked directly on top of the poly material.

In accordance with some illustrative embodiments of the present disclosure, a flash cell may be fabricated in accordance with a process comprising process steps as described above with regard to FIGS. 1a-1o, the flash cell optionally being wired as a NAND flash or a NOR flash or may be used as a single bit storage.

In accordance with some illustrative embodiments of the present disclosure, the gate stack 138 may be connected with a logic PC poly as a word line in subsequent processing (not illustrated).

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a semiconductor device structure, the method comprising:
    providing an SOI substrate comprising a substrate material, an active semiconductor layer positioned above said substrate material, and a buried insulating material interposed between said active semiconductor layer and said substrate material;
    forming an insulating structure in said SOI substrate, said insulating structure laterally separating a first substrate portion of said substrate material from two adjacent SOI substrate portions;
    after forming said insulating structure, forming a recess in said first substrate portion, a bottom of said recess exposing an upper surface portion of said substrate material;
    applying an etching process to said recess, said etching process being unselective with regard to said insulating structure and said substrate material; and
    after applying an etching process to said recess, forming a gate electrode inside of said recess and above said upper surface portion of said substrate material at said bottom of said recess.

2. The method of claim 1, further comprising forming one of a SONOS structure, MONOS structure, and a floating gate structure inside of said recess and above said exposed upper surface portion of said substrate material prior to forming said gate electrode.

3. The method of claim 1, further comprising forming a masking pattern over said first substrate portion and said recess prior to applying said etching process, wherein said substrate material and said insulating structure are unselectively etched in said etching process.

4. The method of claim 3, wherein, during said etching process, said substrate material in said first substrate portion is partially etched back relative to substrate material covered by said masking pattern.

5. The method of claim 1, wherein said insulating structure is partially etched back in said etching process, said etched back insulating structure having a recessed portion adjacent to said substrate material in said first substrate portion.

6. The method of claim 3, further comprising forming a PC masking pattern on said substrate region in alignment with said masking pattern, said PC masking pattern leaving surface regions of said first substrate region adjacent to an upper surface of said gate electrode exposed to further processing.

7. The method of claim 1, wherein said etching process comprises one of a plasma etching process and a reactive ion etch process.

8. The method of claim 1, further comprising forming a first oxide layer on said exposed upper surface portion of said substrate material in said recess and subsequently forming one of a nitride material and a floating gate material on said first oxide layer.

9. The method of claim 8, further comprising forming a second oxide layer on said one of said nitride material and said floating gate material, and subsequently forming said gate electrode.

10. The method of claim 9, wherein forming said gate electrode comprises depositing a gate electrode material over said first substrate region and subsequently leveling said deposited gate electrode material with said adjacent SOI substrate portions.

11. The method of claim 6, wherein said PC masking pattern represents a negative to said masking pattern in said first substrate region.

12. The method of claim 6, further comprising forming a sidewall spacer structure to said gate electrode and subsequently forming at least one of a halo, source/drain extension and deep source/drain implantation region in said substrate material of said first substrate portion.

13. The method of claim 12, further comprising subsequently forming semiconductor devices in and over said adjacent SOI regions.

14. The method of claim 1, wherein forming said recess in said first substrate portion comprises recessing a portion of said insulating structure.

15. The method of claim 1, further comprising, after forming said gate electrode, forming source/drain regions in said substrate material of said first substrate portion.

16. A method of forming a semiconductor device structure, the method comprising:
- providing an SOI substrate comprising a substrate material, an active semiconductor layer positioned above said substrate material, and a buried insulating material interposed between said active semiconductor layer and said substrate material;
- forming an insulating structure in said SOI substrate, said insulating structure laterally separating a first substrate portion of said substrate material from two adjacent SOI substrate portions;
- after forming said insulating structure, forming a recess in said first substrate portion, a bottom of said recess exposing an upper surface portion of said substrate material;
- forming one of a SONOS structure and a floating gate inside of said recess and above said exposed upper surface portion of said substrate material at said bottom of said recess; and
- forming a gate electrode inside of said recess and above said one of said SONOS structure and said floating gate.

17. The method of claim 16, wherein forming said recess in said first substrate portion comprises recessing a portion of said insulating structure.

18. The method of claim 16, further comprising, after forming said gate electrode, forming source/drain regions in said substrate material of said first substrate portion.

19. A method of forming a semiconductor device structure, the method comprising:
- providing an SOI substrate comprising an active semiconductor layer, a substrate material, and a buried insulating material interposed between said active semiconductor layer and said substrate material;
- forming an insulating structure in said SOI substrate, said insulating structure laterally separating a first substrate portion from two adjacent SOI substrate portions;
- forming a recess in said first substrate portion, said recess exposing an upper surface portion of said substrate material;
- forming a first oxide layer on said exposed upper surface portion of said substrate material in said recess;
- forming one of a nitride material and a floating gate material on said first oxide layer;
- forming a second oxide layer on said one of said nitride material and said floating gate material; and
- forming a gate electrode in said recess above said second oxide layer.

* * * * *